(12) United States Patent
Ryu et al.

(10) Patent No.: US 10,705,191 B2
(45) Date of Patent: Jul. 7, 2020

(54) THREE-DIMENSIONAL TIME-OF-FLIGHT SENSORS FOR A TRANSPORTATION SYSTEM

(71) Applicant: STMICROELECTRONICS, INC., Coppell, TX (US)

(72) Inventors: Chang Myung Ryu, San Jose, CA (US); Frederic Morestin, Santa Clara, CA (US); Xiaoyong Yang, San Jose, CA (US)

(73) Assignee: STMICROELECTRONICS, INC., Coppell, TX (US)

( * ) Notice: Subject to any disclaimer, the term of this patent is extended or adjusted under 35 U.S.C. 154(b) by 337 days.

(21) Appl. No.: 15/721,413

(22) Filed: Sep. 29, 2017

(65) Prior Publication Data
US 2019/0033433 A1    Jan. 31, 2019

Related U.S. Application Data

(60) Provisional application No. 62/539,084, filed on Jul. 31, 2017.

(51) Int. Cl.
| | |
|---|---|
| *G01S 7/4865* | (2020.01) |
| *G01S 17/42* | (2006.01) |
| *G01S 17/87* | (2020.01) |
| *G01S 17/89* | (2020.01) |
| *G01S 17/04* | (2020.01) |
| *H01L 31/02* | (2006.01) |
| *H01L 31/107* | (2006.01) |

(52) U.S. Cl.
CPC ............ *G01S 7/4865* (2013.01); *G01S 17/04* (2020.01); *G01S 17/42* (2013.01); *G01S 17/87* (2013.01); *G01S 17/89* (2013.01); *H01L 31/02019* (2013.01); *H01L 31/107* (2013.01)

(58) Field of Classification Search
CPC ...... G01S 7/4865; G01S 7/486; G01S 7/4861; G01S 7/4863; G01S 7/4912; G01S 7/4913; G01S 7/4914; G01S 17/42; G01S 17/87; G01S 17/89
See application file for complete search history.

(56) References Cited

U.S. PATENT DOCUMENTS

| | | | | |
|---|---|---|---|---|
| 5,836,583 | A * | 11/1998 | Towers | A63F 5/00 273/142 B |
| 7,477,758 | B2 * | 1/2009 | Piirainen | B60J 10/00 382/100 |
| 2002/0005778 | A1 * | 1/2002 | Breed | B60Q 9/008 340/435 |
| 2011/0228251 | A1 * | 9/2011 | Yee | G01S 17/36 356/5.01 |

(Continued)

*Primary Examiner* — Eric L Bolda
(74) *Attorney, Agent, or Firm* — Seed IP Law Group LLP (57) ABSTRACT

A method and apparatus for determining space occupancy and performing volumetric measurement of a transportation system using a time-of-flight (TOF) sensor array are provided. In the method and apparatus, the TOF sensor array, which is mounted in a transportation system and includes a plurality of TOF sensors, outputs a plurality of distance measurements made by the plurality of TOF sensors, respectively. In the method and apparatus, a map of one or more objects positioned in the transportation system is generated based on the plurality of distance measurements. The map is output for display to a user by a display.

18 Claims, 5 Drawing Sheets

(56) References Cited

U.S. PATENT DOCUMENTS

| | | | |
|---|---|---|---|
| 2013/0207970 A1* | 8/2013 | Shpunt | G06T 15/00 |
| | | | 345/419 |
| 2015/0291400 A1* | 10/2015 | Rintanen | G06T 7/593 |
| | | | 700/214 |
| 2016/0146595 A1* | 5/2016 | Boufounos | G01S 17/89 |
| | | | 348/47 |
| 2018/0335520 A1* | 11/2018 | Tofte | G01S 17/10 |

* cited by examiner

THREE-DIMENSIONAL TIME-OF-FLIGHT SENSORS FOR A TRANSPORTATION SYSTEM

BACKGROUND

Technical Field

This application is directed to a time-of-flight (TOF) sensor array for use in space occupancy determination and volumetric measurement of a transportation system.

Description of the Related Art

Transportation systems, such as, shipping containers, are ubiquitous. It is time consuming for personnel to inspect the transportation systems in order to determine, at different stops the transportation systems make, whether the objects, such as shipments, placed in the transportation systems have shifted or have been tampered with. Doing so manually would require having a manifest of the objects placed in the transportation system and inspecting the objects at each stop to determine whether they conform with the manifest. Furthermore, it is also time-consuming for personnel to determine the available space in a transportation system or the volume taken up by objects already present in the transportation system.

BRIEF SUMMARY

The present disclosure is directed to an automated system incorporated within a shipping container that can detect an arrangement of the packages in the container. The system can detect a first arrangement and a second arrangement of the packages and compare the first and second arrangement to detect any changes in the positions of the packages. This system can also be used to determine if there is additional space in the container, which can be used to more efficiently pack such a container.

In an embodiment, a system is disclosed. The system includes a first time-of-flight (TOF) sensor array including a plurality of first TOF sensors. A first TOF sensor of the plurality of first TOF sensors is configured to measure a distance between the first TOF sensor and one or more objects positioned in a transportation system and in a field of view of the first TOF sensor and output data representative of the distance measurement. In an embodiment, the system includes a controller communicatively coupled to the first TOF sensor array and configured to receive a plurality of distance measurements made by the plurality of first TOF sensors, respectively, generate, based on the plurality of distance measurements, a three-dimensional (3-D) map of the one or more objects positioned in a transportation system and output data representative of the 3-D map. In an embodiment, the system includes an output device communicatively coupled to the controller and configured to receive the data representative of the 3-D map and display the 3-D map.

In an embodiment, a system includes memory, coupled to the controller, configured to store information representative of inter-TOF sensor spacing within the first TOF sensor array. In an embodiment, the controller is configured to access the information representative of the inter-TOF sensor spacing within the first TOF sensor array, stitch together the plurality of distance measurements based at least in part on the inter-TOF sensor spacing and generate the 3-D map based at least in part on the stitching together of the plurality of distance measurements.

In an embodiment, the memory is configured to store a height at which the plurality of first TOF sensors are mounted in the transportation system and the controller is configured to generate the 3-D map based at least in part on the height at which the plurality of first TOF sensors are mounted in the transportation system. In an embodiment, the first TOF sensor array includes an adhesive for removably mounting the first TOF sensor array to a ceiling, floor or sidewall of the transportation system. In an embodiment, a system includes a second TOF sensor array mounted on a side wall of the transportation container and communicatively coupled to the controller. The second TOF sensor array includes a plurality of second TOF sensors. A second TOF sensor of the plurality of second TOF sensors is configured to measure a lateral distance between the second TOF sensor and the one or more objects positioned in the transportation system and output the lateral distance measurement.

In an embodiment, the controller is configured to receive a plurality of lateral distance measurements made by the plurality of second TOF sensors of the second TOF sensor array, stitch together the plurality of lateral distance measurements based at least in part on inter-TOF sensor spacing of the second TOF sensor array and generate the 3-D map to include a side-view based at least in part on the stitching together of the plurality of lateral distance measurements.

In an embodiment, the 3-D map is a top view of the one or more objects positioned in the transportation system, a side view of the one or more objects positioned in the transportation system, or a bottom view of the one or more objects positioned in the transportation system. In an embodiment, the 3-D map displays heights associated with the one or more objects positioned in the transportation system. In an embodiment, the controller is configured to: generate a subsequent 3-D map, compare the subsequent 3-D map with the 3-D map and output data representative of a difference between the subsequent 3-D map and the 3-D map for determining whether an object of the one or more objects positioned in the transportation system was displaced.

In an embodiment, a method includes measuring, by a first time-of-flight (TOF) sensor of a plurality of first TOF sensors a first TOF sensor array, a distance between the first TOF sensor and one or more objects positioned in a transportation system and in a field of view of the first TOF sensor, outputting, by a first TOF sensor, data representative of the distance measurement, receiving, by a controller communicatively coupled to the first TOF sensor array, a plurality of distance measurements made by the plurality of first TOF sensors, respectively, generating, by the controller, a three-dimensional (3-D) map of the one or more objects positioned in the transportation system based on the plurality of distance measurements, outputting, by the controller, the 3-D map, receiving, by a display communicatively coupled to the controller, the 3-D map and displaying, by the display, the 3-D map.

In an embodiment, generating the 3-D map includes: retrieving, by the controller, information representative of inter-TOF sensor spacing within the first TOF sensor array from memory, stitching together, by the controller, the plurality of distance measurements based at least in part on the inter-TOF sensor spacing and generating the 3-D map based at least in part on the stitching together of the plurality of distance measurements.

In an embodiment, generating the 3-D map includes: retrieving, by the controller, information representative of a height at which the plurality of first TOF sensors are mounted in the transportation system from the memory and generating the 3-D map based at least in part on the height at which the plurality of first TOF sensors are mounted in the transportation system. In an embodiment, a method includes generating, by the controller, a subsequent 3-D map, comparing, by the controller, the subsequent 3-D map with the 3-D map and outputting, by the controller, data representative of a difference between the subsequent 3-D map and the 3-D map for determining whether an object of the one or more objects positioned in the transportation system was displaced.

In an embodiment, a method includes measuring, by a second TOF sensor of a plurality of second TOF sensors of a second TOF sensor array, a lateral distance between the second TOF sensor and the one or more objects positioned in the transportation system and outputting the lateral distance measurement. In an embodiment, a method includes receiving, by the controller, a plurality of lateral distance measurements made by the plurality of second TOF sensors of the second TOF sensor array, stitching together the plurality of lateral distance measurements based at least in part on inter-TOF sensor spacing of the second TOF sensor array and generating the 3-D map to include a side-view based at least in part on the stitching together of the plurality of lateral distance measurements.

In an embodiment, a computer-readable storage medium has stored thereon executable instructions, that when executed by a processor, cause the processor to receive a plurality of distance measurements made by a plurality of first time-of-flight (TOF) sensors, respectively, of a first TOF sensor array mounted in a transportation system, generate a three-dimensional (3-D) map of one or more objects positioned in the transportation system based on the plurality of distance measurements and output the 3-D map for display by a display. In an embodiment, the executable instructions cause the processor to generate the 3-D map by at least: retrieving from memory information representative of inter-TOF sensor spacing within the first TOF sensor array, stitching together the plurality of distance measurements based at least in part on the inter-TOF sensor spacing and generating the 3-D map based at least in part on the stitching together of the plurality of distance measurements.

In an embodiment, the executable instructions cause the processor to: generate a subsequent 3-D map, compare the subsequent 3-D map with the 3-D map and output data representative of a difference between the subsequent 3-D map and the 3-D map for determining whether an object of the one or more objects positioned in the transportation system was displaced. In an embodiment, the 3-D map is a top view of the one or more objects positioned in the transportation system, a side view of the one or more objects positioned in the transportation system, or a bottom view of the one or more objects positioned in the transportation system, and wherein the 3-D map displays heights associated with the one or more objects positioned in the transportation system.

DETAILED DESCRIPTION

Figure 1:
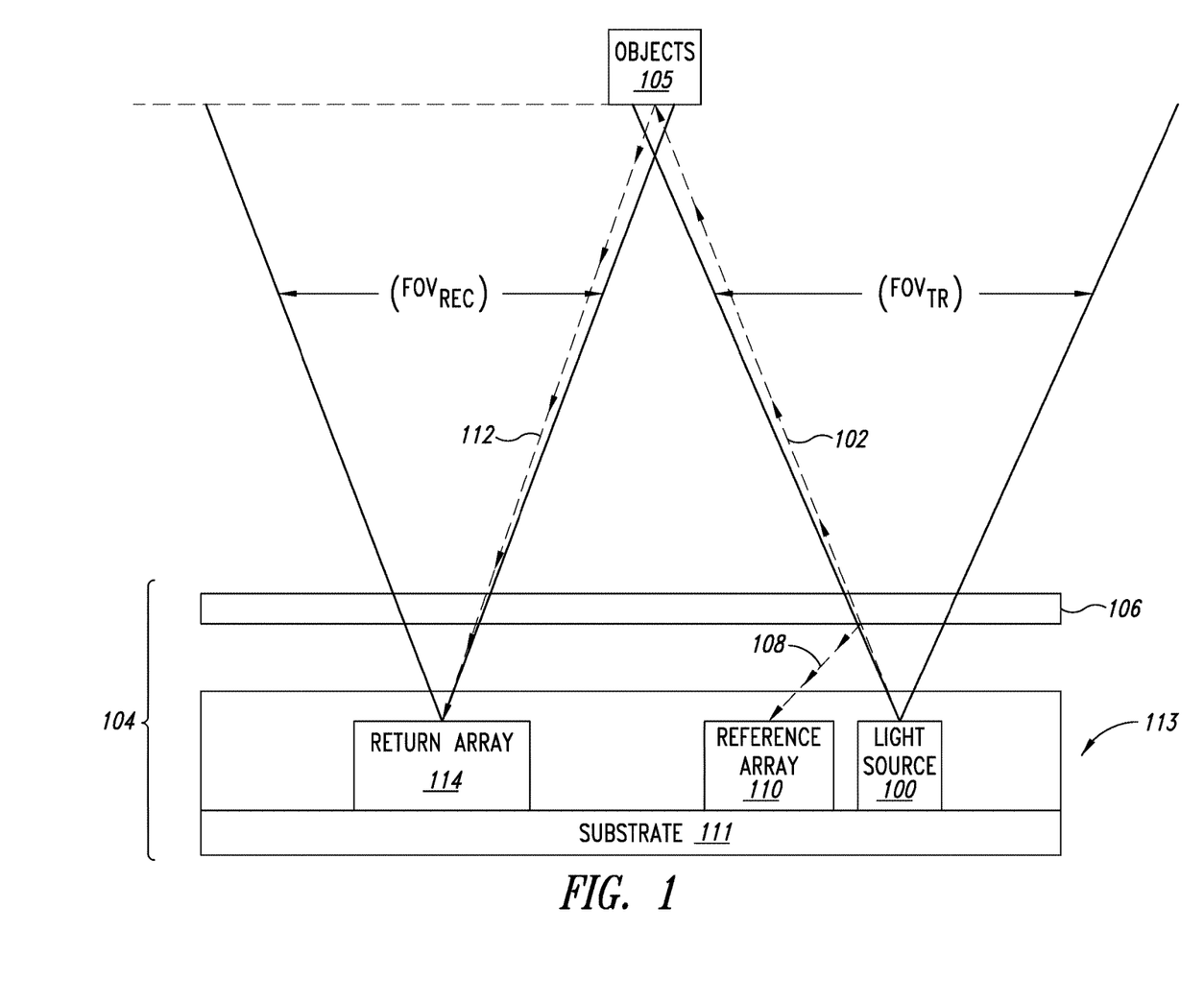
FIG. 1 is a diagram illustrating components and operation of a time-of-flight (TOF) sensor.

The present disclosure is directed to a space occupancy information system that utilizes a time-of-flight (TOF) sensor 104 to determine information about an interior of a container or room. FIG. 1 is a diagram illustrating components and operation of the time-of-flight (TOF) sensor 104 that can be incorporated within the space occupancy information system. The TOF sensor 104 includes a light source 100 and return and reference arrays of photodiodes 114, 110. The light source 100 and the return and reference arrays 114, 110 are formed on a substrate 111. In one embodiment, all the components of the TOF sensor 104 are contained within the same chip or package 113, with all components except for the light source 100 being formed in the same integrated circuit within this package in one embodiment.

The light source 100 transmits optical pulse signals having a transmission field of view $FOV_{TR}$ to irradiate objects within the field of view. A transmitted optical pulse signal 102 is illustrated in FIG. 1 as a dashed line and irradiates an object 105 within the transmission field of view $FOV_{TR}$ of the light source 100. In addition, a reflected portion 108 of the transmitted optical pulse signal 102 reflects off an integrated panel, which may be within a package 113 or may be on a cover 106 of the image capture device 100. The reflected portion 108 of the transmitted pulse is illustrated as reflecting off the cover 106, however, it may be reflected internally within the package 113.

The cover 106 may be glass or the cover may be metal or another material. The cover will include openings to allow the transmitted and return signals to be transmitted and received through the cover if it is not a transparent material.

The reference array 110 of light sensors detects the reflected portion 108 to thereby sense transmission of the optical pulse signal 108. A portion of the transmitted optical pulse signal 102 reflects off objects 105 within the transmission field of view $FOV_{TR}$ as return optical pulse signals 112 that propagate back to the TOF sensor 104. The TOF sensor 104 includes a return array 114 of light sensors having a receiving field of view $FOV_{REC}$ that detects the return optical pulse signals 112. The field of view FOV of the image capture device 100 shown in FIG. 1 includes the transmitting and receiving fields of view $FOV_{TR}$ and $FOV_{REC}$. The sensor 104 then determines respective distances $D_{TOF}$ between the TOF sensor and the objects 105 based upon the time between the reference array 110 sensing transmission of the optical pulse signal 102 and the return array 114 sensing the return optical pulse signal 112. The TOF sensor 104 also generates a signal amplitude SA for each of the detected objects 105 and a confidence value CV indicating whether any of the sensed objects is an object having a high reflective surface.

Figure 2:
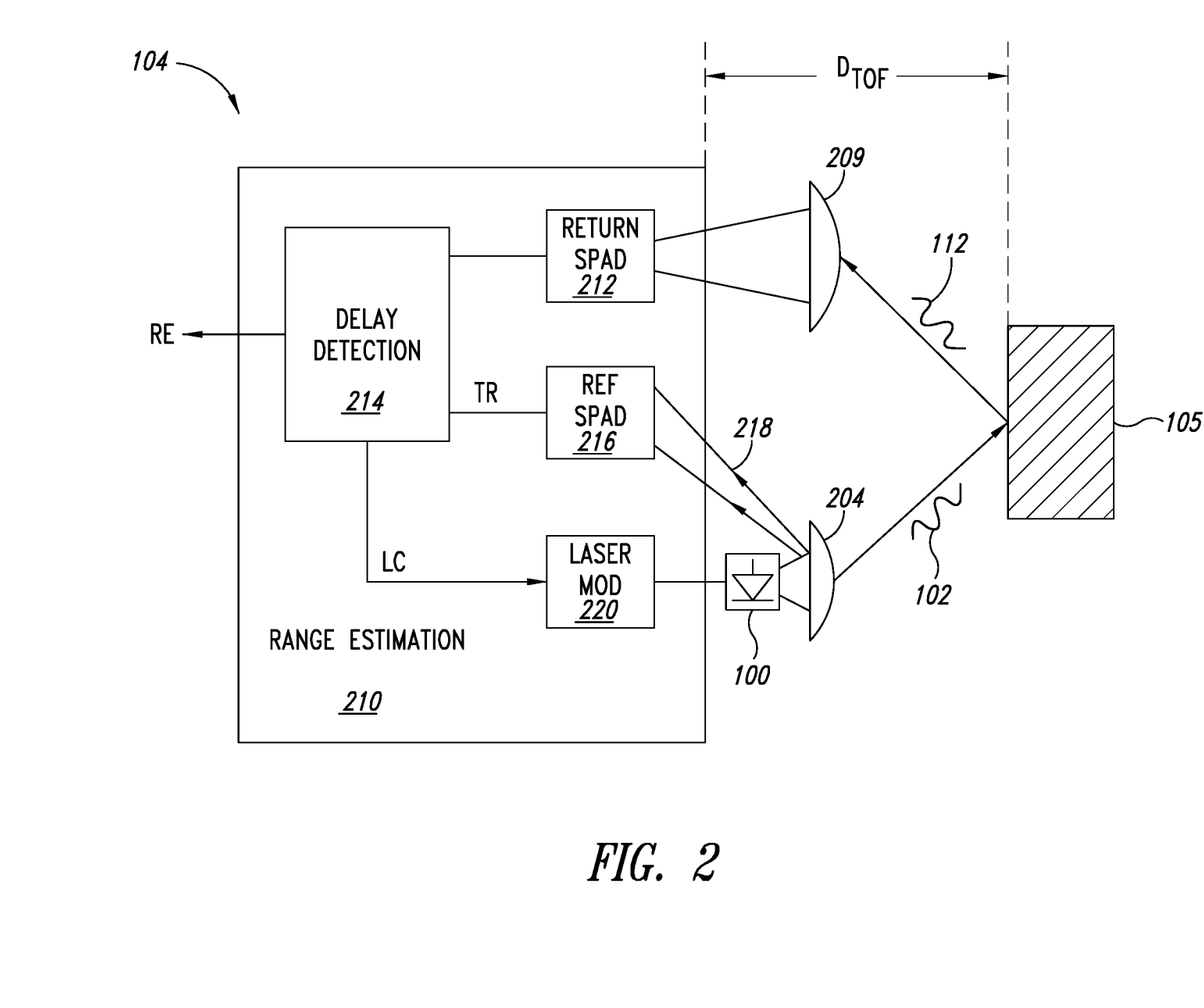
FIG. 2 is a detailed functional block diagram of the TOF sensor described with reference to FIG. 1 according to an embodiment.

FIG. 2 is a detailed functional block diagram of the TOF sensor 104 described with reference to FIG. 1 according to an embodiment. In the embodiment of FIG. 2, the TOF sensor 104 includes a light source 100, which is, for example, a laser diode such as a vertical-cavity surface-emitting laser (VCSEL) for generating the transmitted optical pulse signal designated as 102 in FIG. 2. The transmitted optical pulse signal 102 is transmitted in the transmission field of view $FOV_{TR}$ of the light source 100 as discussed above with reference to FIG. 1. In the embodiment of FIG. 2, the transmitted optical pulse signal 102 is transmitted through a projection lens 204 to focus the transmitted optical pulse signals 102 so as to provide the desired field of view $FOV_{TR}$. The projection lens 204 can be used to control the transmitted field of view $FOV_{TR}$ of the sensor 104 and is an optional component, with some embodiments of the sensor not including the projection lens.

The reflected or return optical pulse signal is designated as 112 in FIG. 2 and corresponds to a portion of the transmitted optical pulse signal 102 that is reflected off objects within the field of view $FOV_{TR}$. One such object 105 is shown in FIG. 2. The return optical pulse signal 112 propagates back and is received through a return lens 209 that provides the desired return or receiving field of view $FOV_{REC}$ for the sensor 104, as described above with reference to FIG. 2. The return lens 209, in this way, is used to control the field of view $FOV_{REC}$ of the sensor 104. The return lens 209 directs the return optical pulse signal 112 to range estimation circuitry 210 for generating the imaging distance $D_{TOF}$ and signal amplitude SA for each object 105. The return lens 209 is an optional component and, thus, some embodiments of the sensor 104 do not include the return lens.

In the embodiment of FIG. 2, the range estimation circuitry 210 includes a return single-photon avalanche diode (SPAD) array 212, which receives the returned optical pulse signal 112 via the lens 209. The SPAD array 212 corresponds to the return array 114 of FIG. 1 and typically includes a large number of SPAD cells (not shown), each cell including a SPAD for sensing a photon of the return optical pulse signal 112. In some embodiments of the sensor 104, the lens 209 directs reflected optical pulse signals 112 from separate spatial zones within the field of view $FOV_{REC}$ of the sensor to certain groups of SPAD cells or zones of SPAD cells in the return SPAD array 212, as will be described in more detail below.

Each SPAD cell in the return SPAD array 212 provides an output pulse or SPAD event when a photon in the form of the return optical pulse signal 112 is detected by that cell in the return SPAD array. A delay detection and processing circuit 214 in the range estimation circuitry 210 determines a delay time between transmission of the transmitted optical pulse signal 102 as sensed by a reference SPAD array 216 and a SPAD event detected by the return SPAD array 212. The reference SPAD array 216 is discussed in more detail below. The SPAD event detected by the return SPAD array 212 corresponds to receipt of the return optical pulse signal 112 at the return SPAD array. In this way, by detecting these SPAD events, the delay detection and processing circuit 214 estimates an arrival time of the return optical pulse signal 112. The delay detection and processing circuit 214 then determines the time of flight TOF based upon the difference between the transmission time of the transmitted optical pulse signal 102 as sensed by the reference SPAD array 216 and the arrival time of the return optical pulse signal 112 as sensed by the SPAD array 212. From the determined time of flight TOF, the delay detection and processing circuit 214 generates the range estimation signal RE indicating the detected distance $D_{TOF}$ between the object 105 and the TOF sensor 104.

The reference SPAD array 216 senses transmission of the transmitted optical pulse signal 102 generated by the light source 100 and generates a transmission signal TR indicating detection of transmission of the transmitted optical pulse signal. The reference SPAD array 216 receives an internal reflection 218 from the lens 204 of a portion of the transmitted optical pulse signal 102 upon transmission of the transmitted optical pulse signal from the light source 100, as discussed for the reference array 110 of FIG. 1. The lenses 204 and 209 in the embodiment of FIG. 2 may be considered to be part of the glass cover 106 or may be internal to the package 113 of FIG. 1. The reference SPAD array 216 effectively receives the internal reflection 218 of the transmitted optical pulse signal 102 at the same time the transmitted optical pulse signal is transmitted. In response to this received internal reflection 218, the reference SPAD array 216 generates a corresponding SPAD event and, in response thereto, generates the transmission signal TR indicating transmission of the transmitted optical pulse signal 102.

The delay detection and processing circuit 214 includes suitable circuitry, such as time-to-digital converters or time-to-analog converters, to determine the time-of-flight TOF between the transmission of the transmitted optical pulse signal 102 and receipt of the reflected or return optical pulse signal 112. The delay detection circuit 214 then utilizes this determined time-of-flight TOF to determine the distance $D_{TOF}$ between the object 105 and the TOF sensor 104. The range estimation circuitry 210 further includes a laser modulation circuit 220 that drives the light source 100. The delay detection and processing circuit 214 generates a laser control signal LC that is applied to the laser modulation circuit 220 to control activation of the laser 100 and thereby control transmission of the transmitted optical pulse signal 102. The range estimation circuitry 210, or more specifically the delay detection and processing circuit 214 contained therein, also determines the signal amplitude SA for each sensed object based upon the SPAD events detected by the return SPAD array 212 for that object. The signal amplitude SA is based on the number of photons of the return optical pulse signal 112 received by the return SPAD array 212. The closer the object 105 is to the TOF sensor 104 the greater the sensed signal amplitude SA and, conversely, the farther away the object the smaller the sensed signal amplitude. In addition, the TOF sensor 104 also utilizes these detected SPAD events and corresponding signal amplitude SA for each object in determining whether the sensed object is a high reflectivity surface, as will be described in more detail below.

Figure 3:
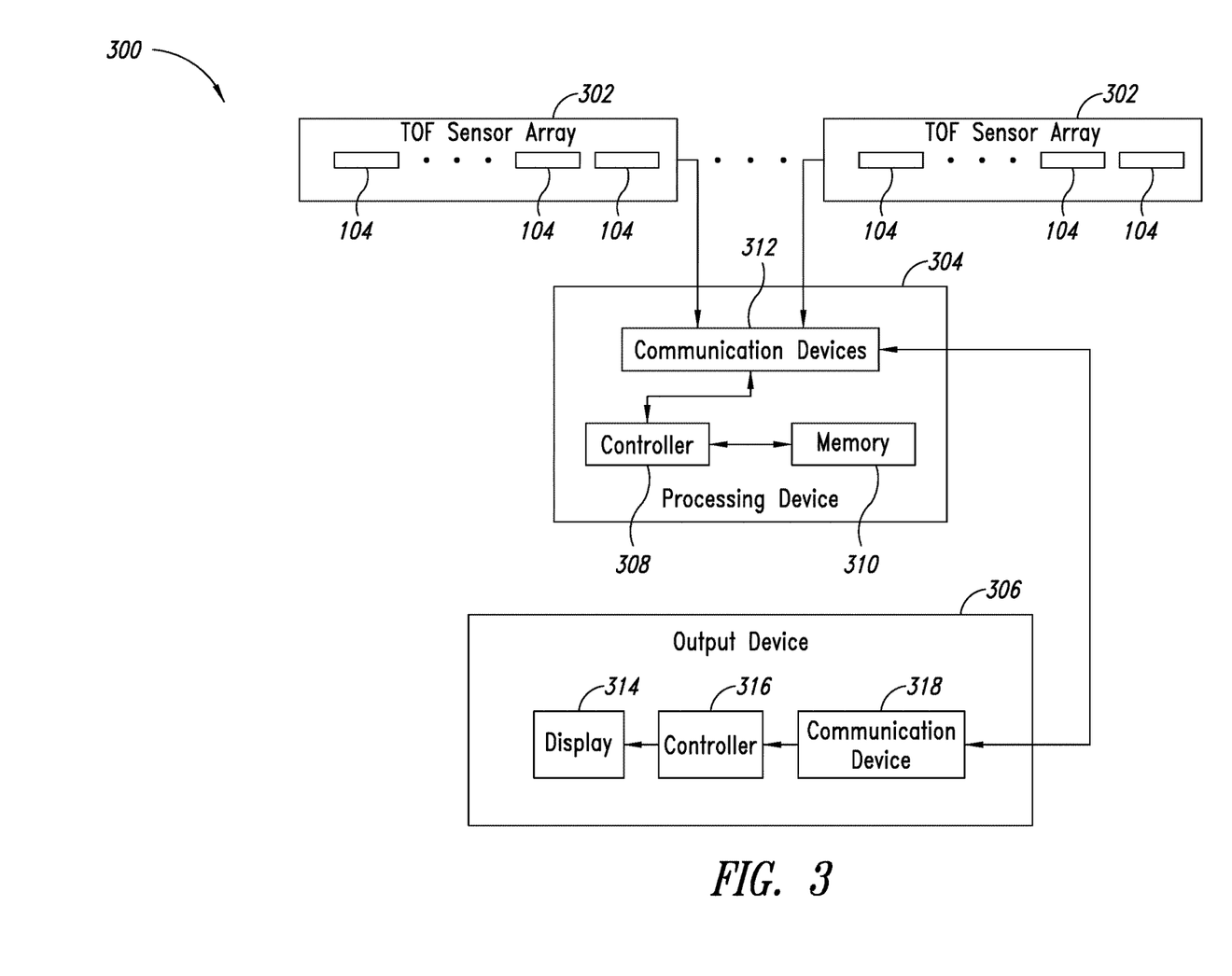
FIG. 3 shows a block diagram of a space occupancy information system.

FIG. 3 shows a block diagram of a space occupancy information system 300. The space occupancy information system 300 includes one or more TOF sensor arrays 302, a processing device 304 and an output device 306. The one or more TOF sensor arrays 302 are communicatively coupled to the processing device 304, and the processing device 304 is communicatively coupled to the output device 306. The one or more TOF sensor arrays 302 may be mounted in a transportation system, such as a shipping or a freight container, a trailer or a vehicle storage compartment. The one or more TOF sensor arrays 302 may sense the proximity to objects located in the transportation system and output data representative of the proximity to the processing device 304.

The processing device 304, which may be a device positioned in the transportation system or a towing device, such as a tractor trailer, processes the data and determines space occupancy information of the transportation system. The processing device 304 outputs the space occupancy information to the output device 306. The output device 306 may be a smartphone, a tablet, a dashboard display of the towing device or an overhead display of the towing device.

A TOF sensor array 302 includes a plurality of TOF sensors 104. The processing device 304 includes a controller 308, memory 310 and a communication device 312. The output device 306 includes a display 314, a controller 316 and a communication device 318.

Each TOF sensor 104 is operative to output data representative of a distance between the TOF sensor 104 and an object 105 in the field of view of the TOF sensor 104. The TOF sensor 104 may output the data directly to the communication device 312 of the processing device 304, for example. That is, the TOF sensor 104 may be equipped with a respective communication device (not shown). The TOF sensor 104 may utilize the communication device to output the data representative of the distance to the processing device's 304 communication device 312.

Alternatively, the TOF sensor array 302 may include a communication device (not shown). The communication device of the array 302 may handle the transmission of the output data of the plurality of TOF sensors 104 of the array 302. For example, each TOF sensor 104 may be communicatively coupled to the communication device of the array 302 by a wireless or a wired connection. The TOF sensor 104 may output the data representative of the distance to the communication device of the array 302, and the communication device of the array 302 may, in turn, output the data to the communication device 312 of the processing device 304.

It is noted that although the TOF sensors 104 are referred to as being in an array, the spatial arrangement of TOF sensors 104 within the array 302 may be linear or nonlinear. The sensors 104 may be positioned within the array 302 on a line with equidistant or non-equidistant spacing therebetween. The sensors 104 may also be arranged in a spatial manner within the array. For example, the sensors 104 may be in the two-dimensional (2-D) or three-dimensional (3-D) matrix with equidistant or non-equidistant spacing between the sensors 104. Each array may include a single TOF chip or multiple TOF chips. The TOF chips may be embedded within a wall of the container or may be on a strip that is placed on a wall of the container.

In the processing device 304, the communication device 312 may be any type of device that is capable of communicating in accordance with a communications protocol. The communication device 312 may be a transceiver, receiver or transmitter. The protocol may be a short range communications protocol or a longer-range communications protocol. The protocol may be a Bluetooth protocol, an Institute for Electrical and Electronics Engineers (IEEE) 802.11 protocol, a cellular communications protocol, such as, a third Generation Partnership Project (3GPP) communications protocol, or an infrared protocol, among others.

The communication device 312 outputs the data to the controller 308. The controller 308 may be any type of device that is configured to receive the data and process the data to determine space occupancy information. The controller 308 may be a processor, microprocessor or microcontroller, among others. The controller 308 is communicatively coupled to the memory 310. The memory 310 may be any type of computer-readable storage media. The memory 310 may be a static or dynamic random access memory (RAM). The memory 310 may also be a read-only memory (ROM). The memory 310 may store instructions, that when executed by the controller 308, cause the controller 308 to operate as described herein.

The controller 308 evaluates the data received from the one or more TOF sensor arrays 302. The controller 308 generates, based on evaluating the data received from the one or more TOF sensor arrays 302, occupancy information of space within the field of view of the one or more TOF sensor arrays 302. The occupancy information may include a depth map, 3-D map, occupied volume information, unoccupied/available volume information or displacement information. The occupancy information may also include point cloud data.

The controller 308 outputs the occupancy information to the communication device 312. The communication device 312 transmits the occupancy information. The output device's 306 own communication device 318 receives the occupancy information. The communication device 318 of the output device 306 may be any kind of device capable of receiving the occupancy information. The communication device 318, which may be a transceiver, may be compliant with the same protocol as the communication device 312 of the processing device 304. The communication device 318, upon receiving the occupancy information, outputs the occupancy information to the controller 316.

The controller 316 processes the occupancy information and outputs the occupancy information to the display 314. The display 314 displays the occupancy information to a user.

The occupancy information may also be transmitted to devices of an operator (not shown), such as, an operator of a fleet of transportation system towing vehicles. The occupancy information may be transmitted by the processing device 304 or the output device 306 over a network, such as a cellular network. For example, the communication devices 312, 318 may be compliant with a cellular networking protocol and may transmit the occupancy information over the cellular network to the operator's devices.

The operator may utilize the occupancy information to determine whether freight positioned in the transportation system has shifted during transportation. Further, the operator may use the occupancy information to plan loading or unloading stops for the towing vehicle or to plan refueling stops for the towing vehicle as described herein.

Figure 4:
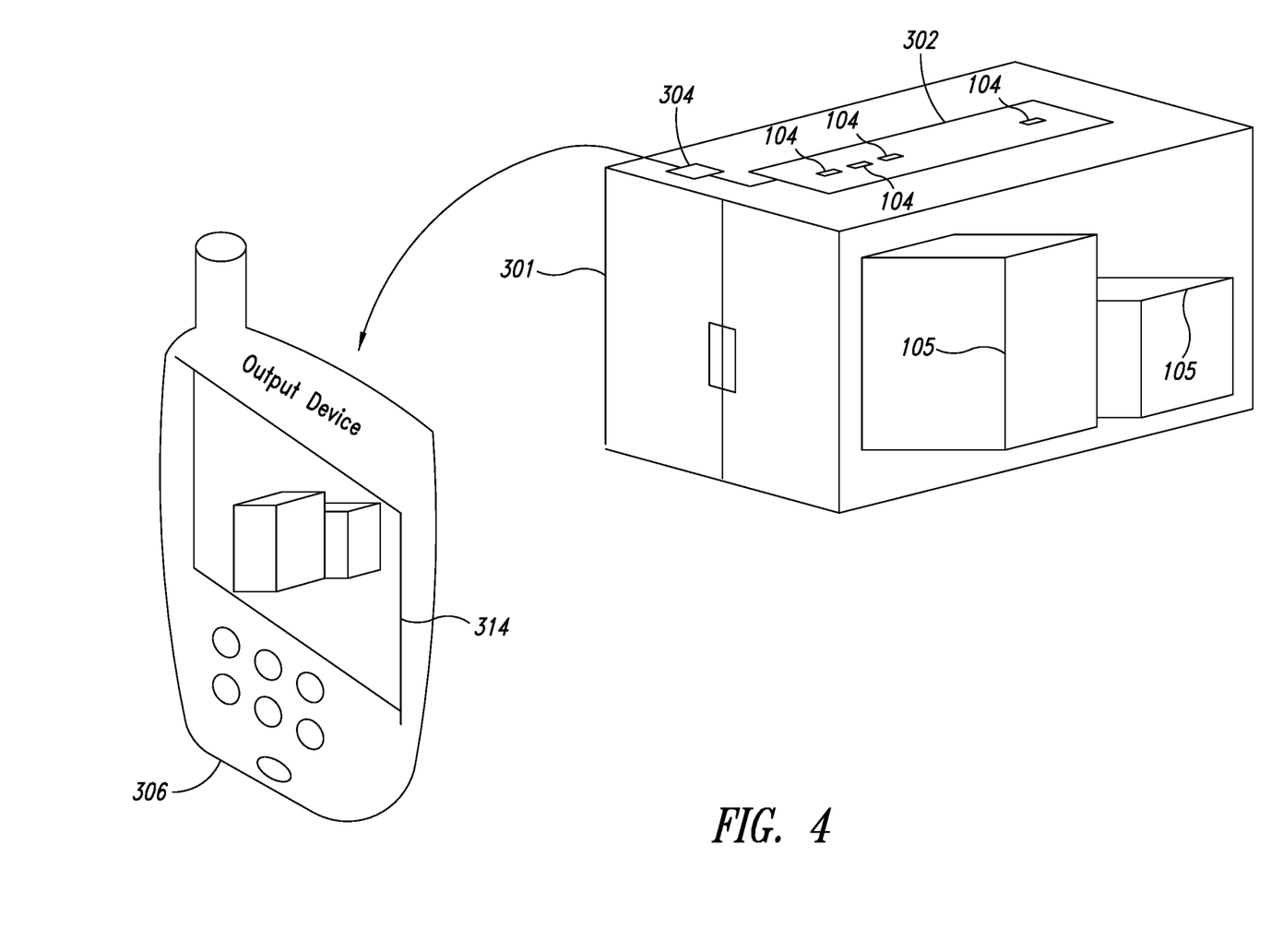
FIG. 4 shows a transportation system having installed thereon a TOF sensor array.

FIG. 4 shows a transportation system 301 having installed thereon a TOF sensor array 302. The transportation system 301 is shown as a shipping container, however, the TOF sensor array 302 may be used with any other object having a volume. The TOF sensor array 302 is shown to be mounted on a ceiling of the transportation system 301. When mounted on the ceiling of the transportation system 301, the field of view of the sensors 104 of the array 302 is directed at, and includes, at least portions of one or more objects 105 located within the transportation system 301.

Because the sensors 104 are spaced apart from each other within the array 302, the combined field of view of the array 302 is greater than that of the individual sensors 104. When the array 302 is mounted longitudinally across the ceiling of the transportation system 301, the array 302 may have a combined field of view that spans the entire length (or almost the entire length) of the transportation system 301.

As described herein, the individual sensors 104 of the array 302 measure the distance between an object in the field of view of a sensor 104 and the sensor 104 itself. By knowing the height at which the sensors 104 or the array 302 are mounted in the transportation system 301 (the distance to the floor of the transportation system 301), the height of an object 105 can be determined based on the difference between the height at which a sensor 104 is mounted and the measured distance.

As described herein, the measurements made by the TOF sensor array 302 may be used, by the processing device 304, to determine space occupancy information of the transportation system 301. Determining the space occupancy information may include constructing a 3-D map of the contents 105 of the transportation system 301.

The processing device 304 outputs of the 3-D map to the output device 306. The output device 306 displays 3-D map. Personnel operating in the field, such as, personnel responsible for packing, unpacking, shipping or moving the transportation system 301, as well as customs or drug enforcement agents, may use the output device 306 to ascertain the contents of the transportation system 301 without having to open the transportation system 301 or unload the contents thereof.

In various embodiments, the TOF sensor array 302 measurements made at two different points in time may be used to determine whether the contents of the transportation system 301 have been changed, shifted, moved or tampered with. For example, the data provided by the TOF sensor array or the 3-D maps generated based on the data may be compared to determine whether there are any changes in the contents of the transportation system 301. For example, a first 3-D map taken prior to shipping the transportation system 301 may be compared with a subsequent 3-D map taken upon arrival of the transportation system 301 to determine whether the content of the transportation system 301 has changed or shifted during shipment. The memory 310 within the processing device 304 can store the data about the contents of the container at the port of origin, which will include information about the location of the various items in the container. At an intermediate point along the journey of the container or at the final destination, another user can access the original starting information from the memory about the location of the contents. The system can output information to the user about a difference between the starting information and the current information, such as if a box within the container has shifted during travel. At an intermediate point in the journey, if the system is activated for monitoring purposes, the system can output a warning signal to the user if the contents have shifted. This could be useful with fragile or volatile cargo.

The TOF sensor array 302 may be mounted or attached to the transportation system 301. The TOF sensor array 302 may, for example, be mounted on a ceiling or a sidewall of the shipping container. The TOF sensors 104 may be mounted on an adhesive strip that is removably attached to the transportation system 301. Further, a sensor 104 may include a magnet that is used to attach the sensor 104 to the transportation system 301. In alternative embodiments, the plurality of time of flight sensors are integrated within or embedded within the container walls such that any wiring is formed within the walls. The container may include an exterior panel, with a display that can be accessed by the user to scan the contents in the container with the system and output depth or position information about the contents of the container. Each container can have a separate space occupancy information system that is integrated within the container and accessible from outside the container. The user can review the contents at a display panel on the exterior of the container. Alternatively, a plurality of the containers having the system integrated within the containers can automatically communicate to a central monitoring station so a group of containers can be monitored simultaneously. The controller 308 of the processing device 304 may construct a depth map or a 3-D map of the contents of the transportation system 301 based on the data output by the TOF sensors 104 and parameters that are a priori known by the controller 308. The controller 308 may determine, based on the data various distances between the sensors 104 of the array 302 and objects in the transportation system 301, a length, width or diagonal line, among others, of the transportation system 301. Further, the controller 308 may determine a depth map or a 3-D map across an entirety of or a portion of the transportation system 301.

In an embodiment, the one or more TOF sensor arrays 302 may be mounted or positioned at different locations in the transportation system 301. For example, one sensor array 302 may be mounted on the ceiling of the transportation system 301 whereas one or more other sensor 302 may be mounted on sidewalls or a floor of the transportation system 301. It is noted that the utilization of multiple TOF sensor arrays 302 allows for improving the sensing capability of the system 300. When a TOF sensor array 302 is mounted on a sidewall of the transportation system 301, the generated 3-D map may include a side view, taken from the sidewall, of the objects 105 in the transportation system 301.

In an embodiment, the processor 304 may determine a space occupancy (or volume of the objects) in the transportation system 301 and output data representative of the space occupancy. Further, the processor 104 may determine an unoccupied space (volume of space that is available) in the transportation system 301 after accounting for the volume occupied by objects positioned in the transportation system 301.

Figure 5:
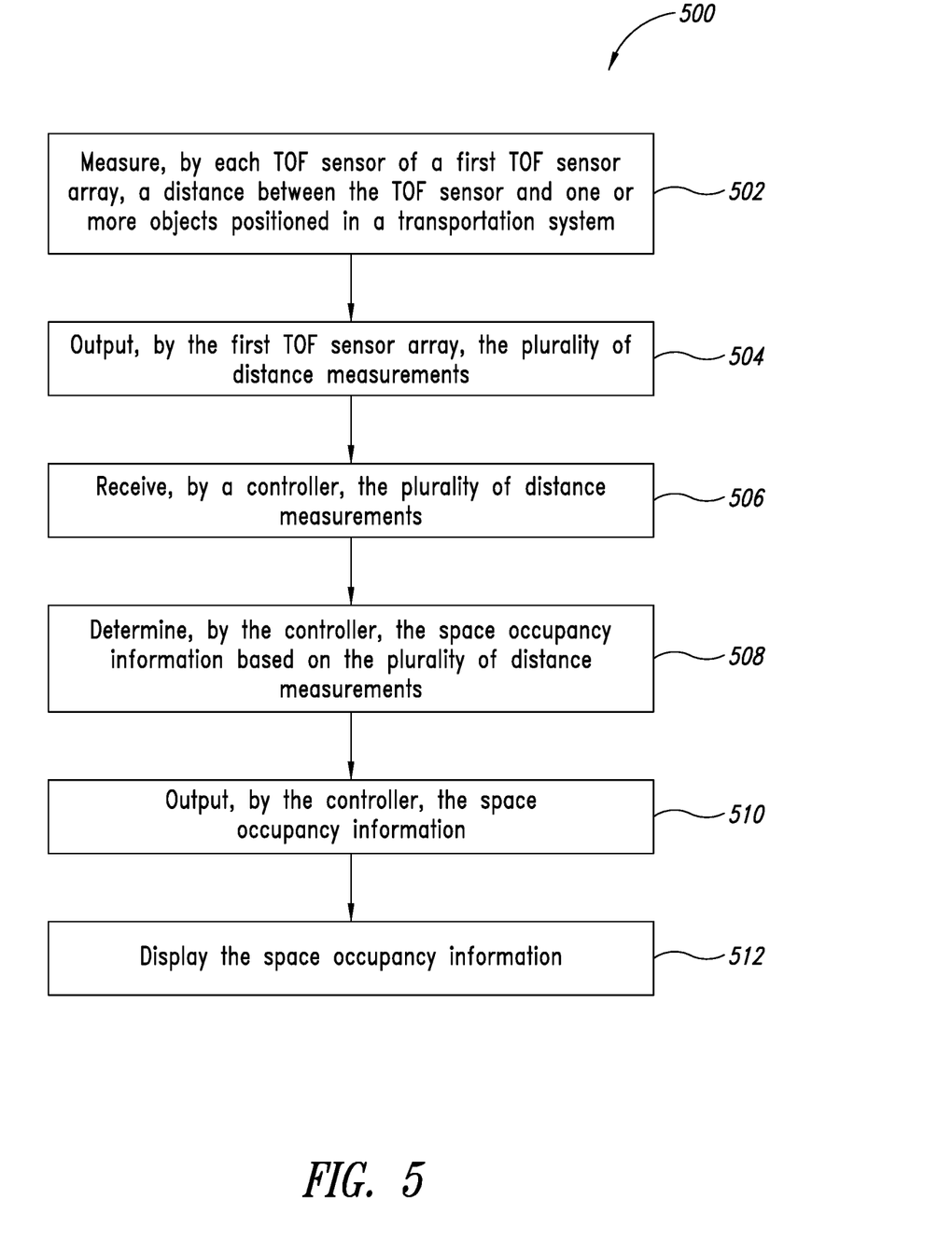
FIG. 5 shows a flow diagram of a method for determining space occupancy information in accordance with at least one embodiment.

FIG. 5 shows a flow diagram of a method for determining space occupancy information in accordance with at least one embodiment. As described herein, determining space occupancy information may include generating a 3-D map or a depth map, estimating available/unoccupied space or estimating occupied space.

In the method 500, at 502, each TOF sensor of a first TOF sensor array comprising a plurality of TOF sensors measures a distance between the TOF sensor and one or more objects positioned in a transportation system. Examples of the first TOF sensor array include the TOF sensor array described with reference to FIG. 3 herein. The one or more objects may be in a field of view of the first TOF sensor array. Each sensor measures the distance between the sensors and an object in its field of view. As described herein, the plurality of TOF sensors may be physically displaced with respect to each other within the first TOF sensor array and may each have different fields of view. The fields of view of the plurality of TOF sensors combine to form an overall or expanded field of view of the first TOF sensor array.

The first TOF sensor array outputs the plurality of distance measurements at 504. For example, the first TOF sensor array may include a Bluetooth communication device and may transmit the plurality of distance measurements using the Bluetooth communication device. At 506, a controller, such as the controller 312 described with reference to FIG. 3, receives the plurality of distance measurements. Similar to the first TOF sensor array, the controller may include a communication device that is compliant with the same protocol as the communication device of the first TOF sensor array. The controller may receive the plurality of distance measurements using the communication device.

At 508, the controller determines space occupancy information based on the plurality of distance measurements. To determine the space occupancy information, the controller may know the spacing between the TOF sensors of the first TOF sensor array or the positioning of the TOF sensors of the first TOF sensor array. The controller spatially stitches together the plurality of distance measurements based on the spacing and/or positioning. Thus, the distance information between the first TOF sensor array and objects in its overall field of view may be determined.

If the space occupancy information is a 3-D map, the controller uses the distance information between the first TOF sensor array and the objects in its field of view to generate the 3-D map. The 3-D map may show the contours and/or edges of each object and the height of each object.

Further, the space occupancy information may be space availability of the transportation system. The available space is the space not taken up or occupied by the detected objects. The controller may determine the available space as a volume that may, for example, be measured in cubic feet or cubic meters. Because the distance information represents the distance between the first TOF sensor array and the objects, the available space as a volume may be determined using the measured distance as the height of the available space.

The space occupancy information may also be space occupied by the objects. The controller may determine the occupied space based on the measured distances and a height at which the first TOF sensor array is mounted. When the height at which the first TOF sensor array is mounted is known, the height of the detected objects may be represented as a difference between the mounting height and the measured distance. Using the width of the objects detected by the TOF sensors and the height of the objects (determined based on the difference between the mounting height and the measured distance), the occupied space may be determined.

Upon determining the space occupancy information (for example, 3-D map, available space or occupied space, among others), the controller outputs the space occupancy information at 510. The controller may use the communication device to transmit the space occupancy information.

An output device, such as, the output device 306 described with reference to FIG. 3, receives the space occupancy information and displays the space occupancy information at 512. For example, the output device may display a 3-D map, the available space or the occupied space. The 3-D map may be displayed as an image, whereas the available space or occupied space may be displayed as volume information, for example, that is measured in cubic meters or cubic feet, among others.

In an embodiment, the space occupancy information may be used to predict future fuel consumption of a towing vehicle of the transportation system. The space occupancy information is indicative of the weight of the objects (or freight) in the transportation system. Because fuel efficiency is inversely proportional to the weight of the freight, the predicted future fuel consumption of the towing vehicle may be determined, by the processing device, the output device or devices of a network or fleet operator, based on the weight. For example, the predicted future fuel consumption may be used to schedule refueling stops for the towing vehicle along a route. Further the predicted future fuel consumption may be used to improve the fuel efficiency of the towing vehicle.

In an embodiment, the space occupancy information may be used to plan loading stops for the towing vehicle along a transportation route. For example, the available space information may be used to determine whether a load (or dimensions thereof) can fit in the transportation system. If so, the towing vehicle may be routed to pick up the load at a particular stop.

In an embodiment, the space occupancy information (for example, 3-D map) may be used to determine whether the objects in a transportation system have shifted during transport. Two 3-D maps taken at different times may be compared. Differences between the two 3-D maps may be indicative of the objects having been shifted or displaced from a time when the first 3-D map was taken to a time when the second 3-D map was taken.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
a first time-of-flight (TOF) sensor array including a plurality of first TOF sensors, a first TOF sensor of the plurality of first TOF sensors being configured to measure a distance between the first TOF sensor and one or more objects positioned in a transportation system and in a field of view of the first TOF sensor and output data representative of the distance measurement;
a controller, communicatively coupled to the first TOF sensor array, configured to:
receive a plurality of distance measurements made by the plurality of first TOF sensors, respectively;
generate, based on the plurality of distance measurements, a three-dimensional (3-D) map of the one or more objects positioned in a transportation system; and
output data representative of the 3-D map;
an output device, communicatively coupled to the controller, configured to:
receive the data representative of the 3-D map; and
display the 3-D map; and
a second TOF sensor array, mounted on a side wall of the transportation system and communicatively coupled to the controller, the second TOF sensor array including a plurality of second TOF sensors, a second TOF sensor of the plurality of second TOF sensors being configured to measure a lateral distance between the second TOF sensor and the one or more objects positioned in the transportation system and output the lateral distance measurement.

2. The system of claim 1, further comprising:
memory, coupled to the controller, configured to store information representative of inter-TOF sensor spacing within the first TOF sensor array.

3. The system of claim 2, wherein the controller is configured to:
access the information representative of the inter-TOF sensor spacing within the first TOF sensor array;
stitch together the plurality of distance measurements based at least in part on the inter-TOF sensor spacing; and
generate the 3-D map based at least in part on the stitching together of the plurality of distance measurements.

4. The system of claim 3, wherein the memory is configured to store a height at which the plurality of first TOF sensors are mounted in the transportation system and the controller is configured to generate the 3-D map based at least in part on the height at which the plurality of first TOF sensors are mounted in the transportation system.

5. The system of claim 1, wherein the first TOF sensor array includes an adhesive for removably mounting the first TOF sensor array to a ceiling, floor or sidewall of the transportation system.

6. The system of claim 1, wherein the controller is configured to:
receive a plurality of lateral distance measurements made by the plurality of second TOF sensors of the second TOF sensor array;
stitch together the plurality of lateral distance measurements based at least in part on inter-TOF sensor spacing of the second TOF sensor array; and
generate the 3-D map to include a side-view based at least in part on the stitching together of the plurality of lateral distance measurements.

7. The system of claim 1, wherein the 3-D map is a top view of the one or more objects positioned in the transportation system, a side view of the one or more objects positioned in the transportation system, or a bottom view of the one or more objects positioned in the transportation system.

8. The system of claim 1, wherein the 3-D map displays heights associated with the one or more objects positioned in the transportation system.

9. The system of claim 1, wherein the controller is configured to:
generate a subsequent 3-D map;
compare the subsequent 3-D map with the 3-D map; and
output data representative of a difference between the subsequent 3-D map and the 3-D map for determining whether an object of the one or more objects positioned in the transportation system was displaced.

10. A method, comprising:
measuring, by a first time-of-flight (TOF) sensor of a plurality of first TOF sensors of a first TOF sensor array, a distance between the first TOF sensor and one or more objects positioned in a transportation system and in a field of view of the first TOF sensor;
outputting, by a first TOF sensor, data representative of the distance measurement;
receiving, by a controller communicatively coupled to the first TOF sensor array, a plurality of distance measurements made by the plurality of first TOF sensors, respectively;
generating, by the controller, a three-dimensional (3-D) map of the one or more objects positioned in the transportation system based on the plurality of distance measurements;
outputting, by the controller, the 3-D map;
receiving, by a display communicatively coupled to the controller, the 3-D map;
displaying, by the display, the 3-D map; and
measuring, by a second TOF sensor of a plurality of second TOF sensors of a second TOF sensor array, a lateral distance between the second TOF sensor and the one or more objects positioned in the transportation system and outputting the lateral distance measurement.

11. The method of claim 10, wherein generating the 3-D map includes:
retrieving, by the controller, information representative of inter-TOF sensor spacing within the first TOF sensor array from memory;
stitching together, by the controller, the plurality of distance measurements based at least in part on the inter-TOF sensor spacing; and
generating the 3-D map based at least in part on the stitching together of the plurality of distance measurements.

12. The method of claim 11, wherein generating the 3-D map includes:
retrieving, by the controller, information representative of a height at which the plurality of first TOF sensors are mounted in the transportation system from the memory; and
generating the 3-D map based at least in part on the height at which the plurality of first TOF sensors are mounted in the transportation system.

13. The method of claim 10, comprising:
generating, by the controller, a subsequent 3-D map;
comparing, by the controller, the subsequent 3-D map with the 3-D map; and
outputting, by the controller, data representative of a difference between the subsequent 3-D map and the 3-D map for determining whether an object of the one or more objects positioned in the transportation system was displaced.

14. The method of claim 10, comprising:
receiving, by the controller, a plurality of lateral distance measurements made by the plurality of second TOF sensors of the second TOF sensor array;
stitching together the plurality of lateral distance measurements based at least in part on inter-TOF sensor spacing of the second TOF sensor array; and
generating the 3-D map to include a side-view based at least in part on the stitching together of the plurality of lateral distance measurements.

15. A computer-readable storage medium having stored thereon executable instructions, that when executed by a processor, cause the processor to:
receive a plurality of distance measurements made by a plurality of first time-of-flight (TOF) sensors, respectively, of a first TOF sensor array, the first TOF sensor array being mounted in a transportation system, and a distance measurement of the plurality of distance measurements being between a respective first TOF sensor of the plurality of first TOF sensors and one or more objects positioned in the transportation system;
receive a plurality of lateral distance measurements made by a plurality of second TOF sensors, respectively, of a second TOF sensor array, the second TOF sensor array being mounted on a side wall of the transportation system, and a lateral distance measurement of the plurality of lateral distance measurements being between a respective second TOF sensor of the plurality of second TOF sensors and the one or more objects positioned in the transportation system;
generate a three-dimensional (3-D) map of one or more objects positioned in the transportation system based on the plurality of distance measurements and the plurality of lateral distance measurements; and
output the 3-D map for display by a display.

16. The computer-readable storage medium of claim 15, wherein the executable instructions cause the processor to generate the 3-D map by at least:
retrieving from memory information representative of inter-TOF sensor spacing within the first TOF sensor array;
stitching together the plurality of distance measurements based at least in part on the inter-TOF sensor spacing; and generating the 3-D map based at least in part on the stitching together of the plurality of distance measurements.

17. The computer-readable storage medium of claim 15, wherein the executable instructions cause the processor to:
generate a subsequent 3-D map;
compare the subsequent 3-D map with the 3-D map; and
output data representative of a difference between the subsequent 3-D map and the 3-D map for determining whether an object of the one or more objects positioned in the transportation system was displaced.

18. The computer-readable storage medium of claim 15, wherein the 3-D map is a top view of the one or more objects positioned in the transportation system, a side view of the one or more objects positioned in the transportation system, or a bottom view of the one or more objects positioned in the transportation system, and wherein the 3-D map displays heights associated with the one or more objects positioned in the transportation system.

* * * * *